United States Patent [19]

Warden

[11] Patent Number: 4,556,758

[45] Date of Patent: Dec. 3, 1985

[54] PADMOUNTED TRANSFORMER

[75] Inventor: Gary A. Warden, Fulton, Mo.

[73] Assignee: Westinghouse Electric Corp., Pittsburgh, Pa.

[21] Appl. No.: 618,843

[22] Filed: Jun. 8, 1984

[51] Int. Cl.[4] .......... H05K 5/02

[52] U.S. Cl. .......... 174/50; 220/337

[58] Field of Search .......... 174/50, 37, 38; 220/337; 336/65, 90; 52/27; 312/100

[56] References Cited

U.S. PATENT DOCUMENTS 3,841,032 10/1974 Grannis, III .......... 174/50 X 3,944,718 3/1976 Bright .......... 174/50

*Primary Examiner*—Laramie E. Askin

*Assistant Examiner*—D. A. Tone

*Attorney, Agent, or Firm*—D. R. Lackey

[57] ABSTRACT

A padmounted transformer having an improved terminal cover-to-tank interface, which improves tamper resistance, improves corrosion resistance, and reduces manufacturing costs. The interface is formed by two equal, opposite facing acute angles in the cover, and a single obtuse angle in the adjacent tank, with the obtuse angle being substantially equal to 180° minus the value of an acute angle. Closure of the terminal cover causes a leg of the obtuse angle to enter the vertex of an acute angle, to create a tortuous path for elongated foreign objects, such as a wire, and for providing a sloping surface which causes prybars to slide out of the interface seam.

5 Claims, 3 Drawing Figures

PADMOUNTED TRANSFORMER

BACKGROUND OF THE INVENTION

1. Field of the Invention:

The invention relates in general to electrical transformers, and more specifically to transformers of the padmount type.

2. Description of the Prior Art:

Padmounted transformers must have a tamper-resistant interface between the terminal cover and tank. While existing padmounted transformers have adequate tamper-resistance interfaces, they all possess certain disadvantages, such as: (a) trapping corrosion promoting moisture via metal overlap areas, (b) possessing "blind spots" which resist painting, which also accelerates corrosion, and/or (c) requiring welding and/or a large number of bends to form the cooperative interface elements, which substantially adds to the labor and material costs.

SUMMARY OF THE INVENTION

Briefly, the present invention is a new and improved padmounted transformer having a tank-cabinet interface which improves the tamper-resistance of the interface while improving corrosion resistance and reducing manufacturing cost. The tamper-resistance is improved by an interface configuration which: (a) presents sloping surfaces to prybars which cause them to slide out before defomring the metal, (b) bends wire more than 90° before actual entry can be achieved, and (c) deflects wire out of the enclosure at an interface corner, when wire is pushed along the seam of the interface. The interface improves corrosion resistance by eliminating (a) welding of the interface components, (b) blind spots which resist painting, and (c) metal-to-metal overlays which trap moisture. The new and improved interface reduces manufacturing cost because welding has been completely eliminated by bending the basic components of the articles being interfaced, the bends are simple and few, and the construction enables automated manufacturing.

BRIEF DESCRIPTION OF THE DRAWINGS

The invention may be better understood, and further advantages and uses thereof more readily apparent, when considered in view of the following detailed description of exemplary embodiments, taken with the accompanying drawings in which.

DESCRIPTION OF PREFERRED EMBODIMENTS

Figure 1:
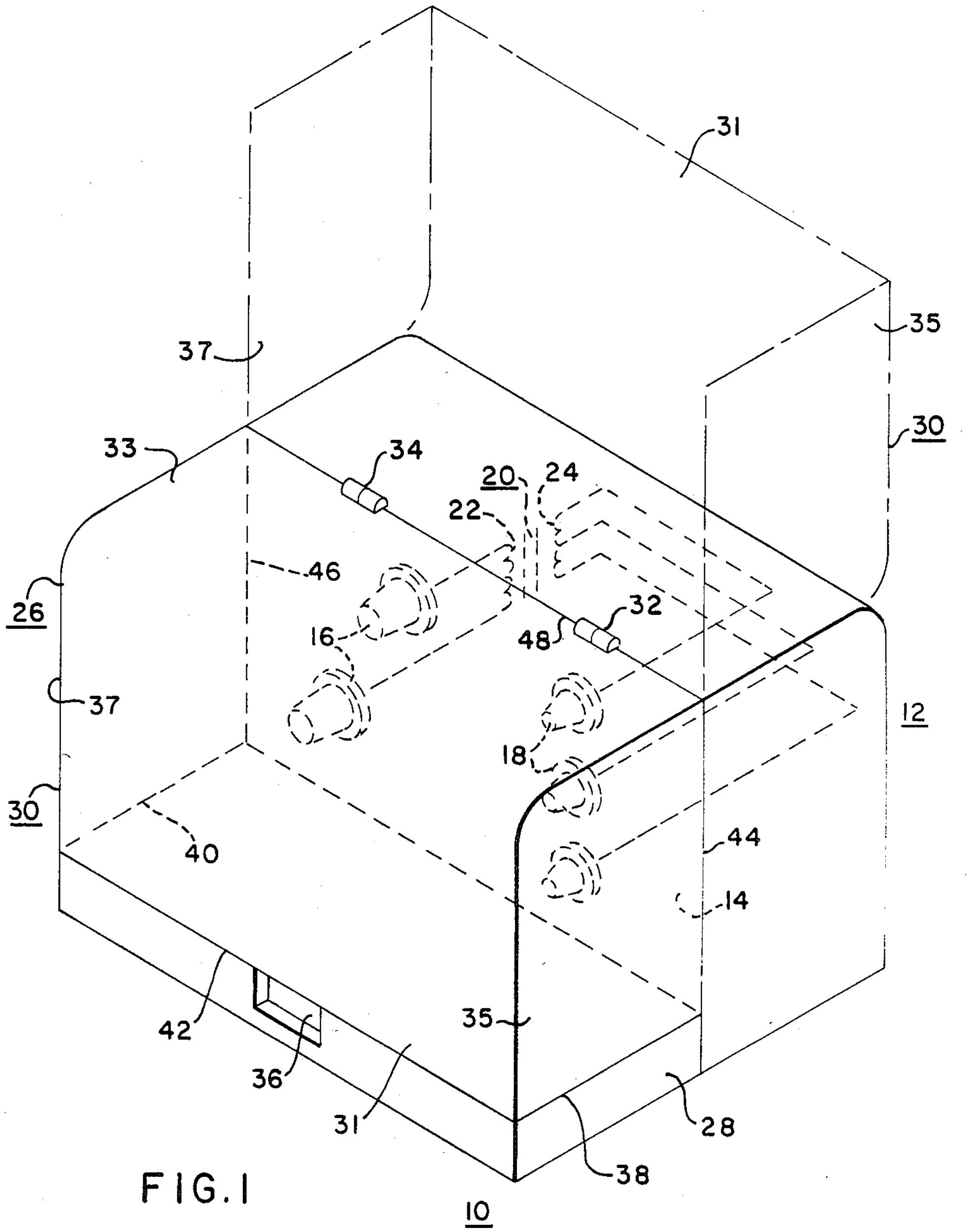
FIG. 1 is a perspective view of a distribution transformer of the type which may be constructed according to the teachings of the invention.

Referring now to the drawings, and to FIG. 1 in particular, there is shown a padmounted electrical distribution transformer 10 of the type which may be constructed according to the teachings of the invention. Transformer 10 includes an enclosed metallic tank 12 having a front surface 14 on which the electrical terminals are mounted, such as high voltage bushings 16 and low voltage bushings 18. A core-coil assembly 20 is disposed within tank 12, immersed in a suitable liquid dielectric, such as mineral oil. The core-coil assembly 20 includes a primary winding 22 which is connected to the high voltage bushings 16 and a secondary winding 24 which is connected to the low voltage bushings 18.

A cabinet or compartment 26 is formed adjacent to the front 14 of tank 12, for enclosing the bushings 16 and 18, the cables which rise from the ground and connect to the bushings, as well as the other items commonly disposed on the front of the tank 12. Cabinet 26 includes a U-shaped sill 28 which is attached to the tank 12, and a terminal cover or hood 30 which is pivotally attached to the tank 12 via hinges 32 and 34. Cover 30 has an open position, shown in phantom, which enables authorized personnel to gain access to the cable compartment, and a closed position, which is shown in solid. In the closed position, cover 30 is locked to the sill 28 via a padlock (not shown) in a sill recess 36, and the cover 30 cooperates with the sill 28 to provide tamper-resistant side interfaces 38 and 40, and a front interface 42. Cover 30 also cooperates with the tank 12 to provide tamper-resistant side interfaces 44 and 46, and a top interface 48. The present invention is directed to a new and improved interface suitable for the side interfaces 44 and 46, and the top interface 48.

Figure 3:
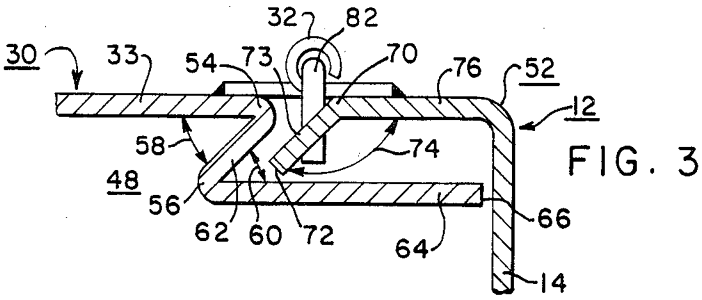
FIG. 3 is an enlarged cross-sectional view of the tank-terminal cover interface shown in FIG. 2, taken between and in the direction of arrows III—III.
Figure 2:
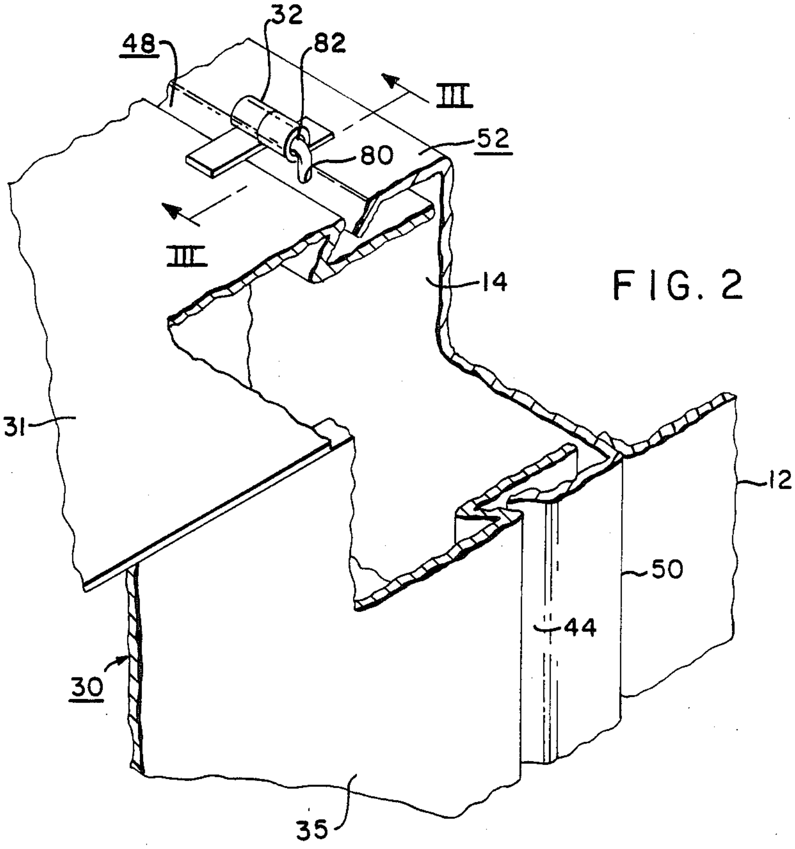
FIG. 2 is a fragmentary, perspective view, with parts cut away, illustrating a tank-terminal cover interface constructed according to the teachings of the invention.

FIG. 2 is a fragmentary perspective view which illustrates the side and top interfaces 44 and 48, respectively, constructed according to the teachings of the invention. Interface 46 is also of like construction. FIG. 3 is a cross-sectional view of the top interface 48, taken between and in the direction of arrows III—III in FIG. 2. Since the construction of all three interfaces 44, 46 and 48 are the same, only the construction of the top interface 48 will be described in detail.

More specifically, the front 14 of tank 12 is constructed with integral extensions or flanges along its vertically extending sides and top, such as extension 50 on the side associated with interface 44 and extension 52 on the top, which is associated with interface 48. These extensions recess the front 14, and also form an active, essential part of the terminal cover-tank interface.

The basic flat metallic sheet which forms each of the cover portions 33, 35 and 37 is bent into a configuration which is substantially Z-shaped, when viewed in cross section, with the Z configuration being formed in the portion of each sheet which is immediately adjacent to the tank wall 14. The Z configuration is formed by first and second bends 54 and 56, respectively, which form first and second equal, opposite facing, acute angles 58 and 60, respectively. Angles 58 and 60 have a common leg portion 62. The unmodified flat portion of metallic sheet 33 forms the remaining leg portion of angle 58, and angle 60 includes a leg portion 64 which terminates at the edge 66 on top portion 33. Since angles 58 and 60 are substantially equal, leg portion 64 is substantially parallel with the unmodified top portion 33.

The extension or flange 52 from the front 14 of tank 12 is bent at a bend 70, with bend 70 being spaced from and parallel to the edge 72 which terminates the flange. Bend 70 forms a leg portion 73 which makes a predetermined obtuse angle 74 with the unmodified portion 76 of flange 52. Portion 76 is co-planar with the unmodified portion 33. Obtuse angle 74 is selected to be equal to 180° minus the value selected for the acute angles.

Thus, if the acute angles are 45°, for example, the obtuse angle 74 would be 135°.

Assembly of the cover 30 with tank 12 via hinges 32 and 34 automatically creates the self-aligning interfaces of the invention, when cover 30 is pivoted to its closed position. The leg portion 73 of the tank portion of the interface extends into and substantially bisects the vertex of the second acute angle 60. Leg portion 73 should be selected to be as long as possible, without interfering or contacting the legs of angle 60. The Z configuration, being on the movable component, i.e., on the cover 30, swings away from leg portion 73 when the cover 30 is pivoted to its open position. If the Z configuration were to be applied to the stationary component, i.e., to the tank, leg portion 73 would intefere with leg portion 64, and this is the primary reason for forming the Z configuration in the cover portion of the interface. Another advantage of forming the Z configuration in the cover portion of the interface is the fact that the leg portion 64 may be sized such that edge 66 will be closely adjacent to the outer surface of the tank wall 14, when the cover 30 is in its closed position. This adds substantially to the tamper resistance of the interface. Edge 66 is spaced from wall 14 just enough to prevent the trapping of moisture.

As illustrated in FIGS. 2 and 3, leg portion 73 may be provided with slots adjacent to the hinges 32 and 34, such as slot 80, for capturing a leg portion of an L-shaped hinge pin 82, thus preventing removal of the hinge pin when cover 30 is closed.

In summary, the present invention is a new and improved padmounted transformer having a tamper-resistant interface between the terminal cover and tank which requires no welding, it forms no blind spots which resist application of paint, and it forms no moisture traps, thus greatly improving the corrosion resistance of the padmounted transformer. The lack of welding and the three simple bends reduce material and labor costs while facilitating the automated construction of the various components. Finally, the disclosed construction enhances the tamper-resistance of the tank-terminal cover interface, as it creates a tortuous path for a wire, causing it to be sharply bent, i.e., more than 90° , and then directed into a box-like enclosure from which there is little chance of escape, directing a wire against a harmless flat portion of the tank wall. Pushing a wire along the seam of the interface will simply deflect it outwardly at an interface corner. The sloped surfaces of the exposed portion of the interface cause prybars to slide out without gaining an edge for applying metal bending pressure.

I claim as my invention:

1. A padmounted transformer, comprising:

a tank having electrical terminals on a predetermined wall thereof, and a terminal cover pivotally attached to said tank, said cover having a closed position, with said cover and tank having portions which cooperatively define a tamper-resistant tank-cover interface, and an open position, one portion of said interface having leg portions which define a predetermined acute angle, and the other portion having leg portions which define an obtuse angle substantially equal to 180° minus the value of the acute angle, with a leg portion of the obtuse angle extending into the vertex of the acute angle when said cover is in its closed position.

2. The padmounted transformer of claim 1 wherein the acute angle is in the cover portion of the tank-cover interface, with a leg portion of the predetermined acute angle terminating closely adjacent to the predetermined tank wall, when the cover is in its closed position.

3. The padmounted transformer of claim 1 wherein the portion of the interface which defines the predetermined acute angle includes leg portions which define first and second equal, opposite facing, acute angles having a common leg portion, with the second acute angle being the predetermined acute angle which cooperates with the obtuse angle of the other portion of the interface.

4. The padmounted transformer of claim 3 wherein the cover includes major, flat top, side and front portions, with the non-common leg portion of the first acute angle being integral with each of the major, flat top and side portions.

5. The padmounted transformer of claim 4 wherein the major surface of the non-common leg portion of the first acute angle is co-planar with the major surface of a leg portion of the obtuse angle, when the cover is in its closed position.

* * * * *